(12) United States Patent
Agarwal et al.

(10) Patent No.: US 12,183,675 B2
(45) Date of Patent: Dec. 31, 2024

(54) FAN-OUT PACKAGES WITH WARPAGE RESISTANCE

(71) Applicant: ADVANCED MICRO DEVICES, INC., Santa Clara, CA (US)

(72) Inventors: Rahul Agarwal, Livermore, CA (US); Chia-Hao Cheng, Hsinchu (TW); Milind S. Bhagavat, Los Altos, CA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 656 days.

(21) Appl. No.: 16/351,728

(22) Filed: Mar. 13, 2019

(65) Prior Publication Data

US 2020/0294914 A1 Sep. 17, 2020

(51) Int. Cl.
| | | |
|---|---|---|
| *H01L 23/528* | (2006.01) | |
| *H01L 21/56* | (2006.01) | |
| *H01L 23/00* | (2006.01) | |
| *H01L 23/31* | (2006.01) | |

(Continued)

(52) U.S. Cl.
CPC ........ *H01L 23/5283* (2013.01); *H01L 21/565* (2013.01); *H01L 23/3128* (2013.01); *H01L 23/5226* (2013.01); *H01L 24/17* (2013.01); *H01L 25/0655* (2013.01); *H01L 2224/0231* (2013.01); *H01L 2224/02373* (2013.01); *H01L 2224/02379* (2013.01); *H01L 2224/02381* (2013.01); *H01L 2224/0401* (2013.01); *H01L 2924/3511* (2013.01)

(58) Field of Classification Search
CPC ............. H01L 23/5283; H01L 23/3128; H01L 23/5226; H01L 23/5383; H01L 23/49827; H01L 21/565; H01L 21/4853; H01L 21/486; H01L 24/17; H01L 2224/0231; H01L 2224/02373; H01L 2224/02379
See application file for complete search history.

(56) References Cited

U.S. PATENT DOCUMENTS

| | | | |
|---|---|---|---|
| 9,607,919 B2 * | 3/2017 | Lee | .......................... H01L 24/97 |
| 9,941,260 B2 * | 4/2018 | Lin | ....................... H01L 25/105 |
| 10,269,744 B2 * | 4/2019 | Lee | ....................... H01L 21/568 |

(Continued)

FOREIGN PATENT DOCUMENTS

| | | |
|---|---|---|
| JP | 2014096547 A | 5/2014 |
| JP | 2017204511 A | 11/2017 |

(Continued)

OTHER PUBLICATIONS

PCT/US2020/016770 International Search Report and Written Opinion mailed Jun. 8, 2020.

(Continued)

*Primary Examiner* — Dao H Nguyen

(57) ABSTRACT

Various molded fan-out semiconductor chip devices are disclosed. In one aspect, a semiconductor chip device is provided that includes a first molding layer that has internal conductor structures, a redistribution layer (RDL) structure positioned on the first molding layer and electrically connected to the internal conductor structures, a semiconductor chip positioned on and electrically connected to the RDL structure, and a second molding layer positioned on the RDL structure and at least partially encapsulating the semiconductor chip.

18 Claims, 11 Drawing Sheets

(51) Int. Cl.
*H01L 23/522* (2006.01)
*H01L 25/065* (2023.01)

(56) References Cited

U.S. PATENT DOCUMENTS

| | | | |
|---|---|---|---|
| 10,276,508 B2* | 4/2019 | Ho | H01L 24/96 |
| 10,276,543 B1* | 4/2019 | Liao | H01L 23/544 |
| 10,475,774 B2* | 11/2019 | Song | G11C 5/04 |
| 10,692,823 B2 | 6/2020 | Sakai | |
| 2005/0099783 A1 | 5/2005 | Alcoe et al. | |
| 2009/0045512 A1 | 2/2009 | Hedler et al. | |
| 2010/0068853 A1 | 3/2010 | Takamatsu | |
| 2015/0070863 A1 | 3/2015 | Yun et al. | |
| 2015/0255361 A1 | 9/2015 | Lee et al. | |
| 2015/0311182 A1 | 10/2015 | Lee et al. | |
| 2016/0240480 A1* | 8/2016 | Lin | H01L 23/3135 |
| 2017/0062391 A1 | 3/2017 | Chen et al. | |
| 2017/0141088 A1 | 5/2017 | Zhai et al. | |
| 2017/0194290 A1 | 7/2017 | Yu et al. | |
| 2017/0263518 A1 | 9/2017 | Yu et al. | |
| 2018/0005984 A1 | 1/2018 | Yu et al. | |
| 2018/0226333 A1 | 8/2018 | Shih | |
| 2018/0269145 A1 | 9/2018 | Paek et al. | |
| 2019/0181112 A1* | 6/2019 | Hu | H01L 27/14627 |
| 2019/0326273 A1* | 10/2019 | Bhagavat | H01L 23/5389 |
| 2022/0262753 A1 | 8/2022 | Lee et al. | |

FOREIGN PATENT DOCUMENTS

| | | |
|---|---|---|
| JP | 2018514088 A | 5/2018 |
| KR | 20140058268 A | 5/2014 |
| KR | 20150104467 A | 9/2015 |
| KR | 1020170141733 | 12/2017 |
| WO | 2013147359 A1 | 10/2013 |
| WO | 2016171805 A1 | 10/2016 |

OTHER PUBLICATIONS

TechPowerUp GPU Database; *NVIDIA Tesla P100 SXM2*; https://www.techpowerup.com/gpudb/2835/tesla-p100-sxm2; Mar. 12, 2018; pp. 1-4.

Sandeep Kumar Samal et al.; *Adaptive Regression-Based Thermal Modeling and Optimization for Monolithic 3-D ICs*; IEEE Transactions on Computer-Aided Design of Integrated Circuits and Systems; vol. 35; No. 10; Oct. 2016; pp. 1707-1720.

Extended European Search Report, EP Application No. 20769466.2, Nov. 11, 2022, 9 pages.

* cited by examiner

FAN-OUT PACKAGES WITH WARPAGE RESISTANCE

BACKGROUND OF THE INVENTION

A conventional fan-out semiconductor chip package consists of a semiconductor chip mounted on a redistribution layer (RDL) structure that is composed of one or more layers of metallization interspersed in a polymer, such as polyimide. The chip is electrically connected to the conductor structures of the RDL structure by way of solder bumps. The chip itself is encased in a molding material that is typically planarized to form a flat upper surface. Solder balls are attached to the underside of the RDL structure to enable the fan-out package to be connected to some other circuit board, such as a system board. Silicon, which is commonly used for semiconductor chips, exhibits a certain coefficient of thermal expansion "CTE". Typical molding compounds and polyimide have CTEs that differ sometimes significantly from that of silicon. To help alleviate issues of CTE mismatch, an underfill material is typically interposed between the semiconductor chip and the underlying RDL structure.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
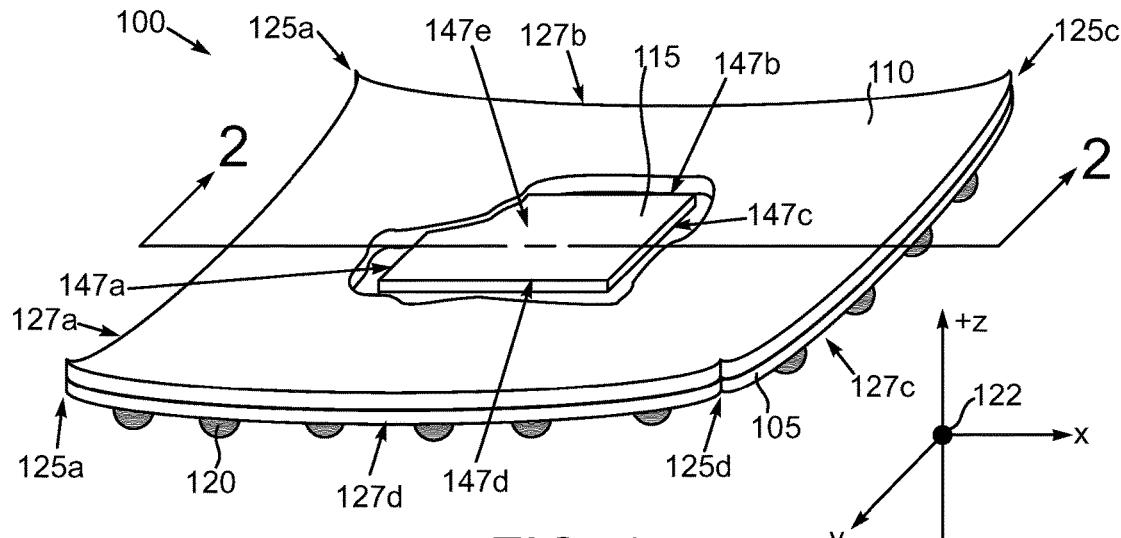
FIG. 1 is a pictorial view of an exemplary conventional molded fan-out package.

Conventional fan-out packages are prone to warpage issues. The causes of warpage are typically the result of mismatches in the CTEs of the semiconductor chip, the underfill, the molding material that encapsulates the semiconductor chip and the polymer layers that make up the RDL structure that the chip is seated on. In addition, there are differences in modulii between the various components of the conventional fan-out package, which also contributes to warpage. Because of the tendency for conventional fan-out packaging to experience warpage issues, typical conventional RDL structures are limited to two or three RDL layers and the footprint or size of conventional packages is limited to some maximum size, which may be less than optimal. One other issue related to warpage is a fact that for molded fan-out packages, the molding compound is present on five but not all six sides of a semiconductor chip. The sixth side is the side of the chip that faces towards the RDL structure and molding does not invade that space.

The disclosed arrangements are designed to address warpage issues to enable RDL layers to number greater than two or three and combat molded fan-out package warpage issues. Some of the disclosed arrangements use a second molding layer that includes internal conductor structures to combat warpage. Other arrangements use multiple sets of RDL layers fabricated before and after a semiconductor chip is mounted. Still others utilize fan-out on fan-out arrangements.

In accordance with one aspect of the present invention, a semiconductor chip device is provided that includes a first molding layer that has internal conductor structures, a redistribution layer (RDL) structure positioned on the first molding layer and electrically connected to the internal conductor structures, a semiconductor chip positioned on and electrically connected to the RDL structure, and a second molding layer positioned on the RDL structure and at least partially encapsulating the semiconductor chip.

The semiconductor chip device, wherein the internal conductor structures comprise conductive pillars.

The semiconductor chip device, comprising plural interconnects electrically connected to the internal conductor structures and configured to electrically connect the semiconductor chip to a circuit board.

The semiconductor chip device, wherein the RDL structure comprises n redistribution layers.

In accordance with another aspect of the present invention, a method of manufacturing a semiconductor chip device is provided. The method includes forming a first molding layer having internal conductor structures, forming a redistribution layer (RDL) structure on the first molding layer and electrically connected to the internal conductor structures, mounting a semiconductor chip on and in electrical connection with the RDL structure, and forming a second molding layer the RDL structure and at least partially encapsulating the semiconductor chip.

The method, wherein the internal conductor structures comprise conductive pillars.

The method, comprising electrically connecting plural interconnects to the internal conductor structures, the interconnects being configured to electrically connect the semiconductor chip to a circuit board.

The method, wherein the RDL structure comprises n redistribution layers.

The method, comprising thinning the second molding layer.

In accordance with another aspect of the present invention, a method of manufacturing a semiconductor chip device is provided. The method includes forming a first set of n redistribution layer (RDL) structure layers, the first set of RDL structure layers having a first side and a second side opposite to the first side, mounting a semiconductor chip on the first side, and after mounting the semiconductor chip, forming a second set of m RDL structure layers on the second side of the first set of n RDL structure layers.

The method, comprising forming a molding layer on the first set of n RDL structure layers at least partially encapsulating the semiconductor chip before forming the second set of m RDL structure layers.

The method, comprising thinning the molding layer.

The method, comprising forming the first set of n RDL structure layers on a carrier wafer.

In accordance with another aspect of the present invention, a semiconductor chip device is provided that includes a first molding layer that has internal conductor structures, a first redistribution layer (RDL) structure positioned on the first molding layer and including fan-out connections to the internal conductor structures, a second RDL structure positioned on the first RDL structure and including fan-out connections to the first RDL structure, a semiconductor chip positioned on and electrically connected to the second RDL structure, and a second molding layer positioned on the RDL structure and at least partially encapsulating the semiconductor chip.

The semiconductor chip device, wherein the internal conductor structures comprise conductive pillars.

The semiconductor chip device, wherein the first RDL structure comprises n redistribution layers and the second RDL structure comprises m redistribution layers.

In accordance with another aspect of the present invention, a method of manufacturing a semiconductor chip device is provided. The method includes forming a first molding layer having internal conductor structures, forming a first redistribution layer (RDL) structure on the first molding layer and including fan-out connections to the internal conductor structures, forming a second RDL structure on the first RDL structure and including fan-out connections to the first RDL structure, mounting a semiconductor chip on and in electrical connection with the second RDL structure, and forming a second molding layer on the RDL structure and at least partially encapsulating the semiconductor chip.

The method, comprising electrically connecting plural interconnects to the internal conductor structures, the interconnects being configured to electrically connect the semiconductor chip to a circuit board.

The method, wherein the internal conductor structures comprise conductive pillars.

The method, wherein the first RDL structure comprises n redistribution layers and the second RDL structure comprises m redistribution layers.

In the drawings described below, reference numerals are generally repeated where identical elements appear in more than one figure. Turning now to the drawings, and in particular to FIG. 1, therein is shown a pictorial view of an exemplary conventional molded fan-out package 100 that includes a redistribution layer (RDL) structure 105, a molding layer 110 molded on the RDL structure 105 and a semiconductor chip 115 encased in the molding layer 110. A portion of the molding layer 110 is shown cut away to reveal a portion of the semiconductor chip 115. The RDL structure 105 includes plural solder balls 120 projecting downwardly therefrom. FIG. 1 depicts a warpage situation that can occur with conventional molded fan-out packages like the molded fan-out package 100. A rectangular coordinate system 122 is depicted simply to aid in the description of warpage situations herein. Here, both the RDL structure 105 and the molding layer 110 exhibit a warpage in the upward or +z direction, which could be considered upward or downward depending on the spatial orientation of the molded fan-out package 100. The amount of warpage can be most severe at the corners 125a, 125b, 125c and 125d and edges 127a, 127b, 127c and 127d of the molded fan-out package 100.

Figure 2:
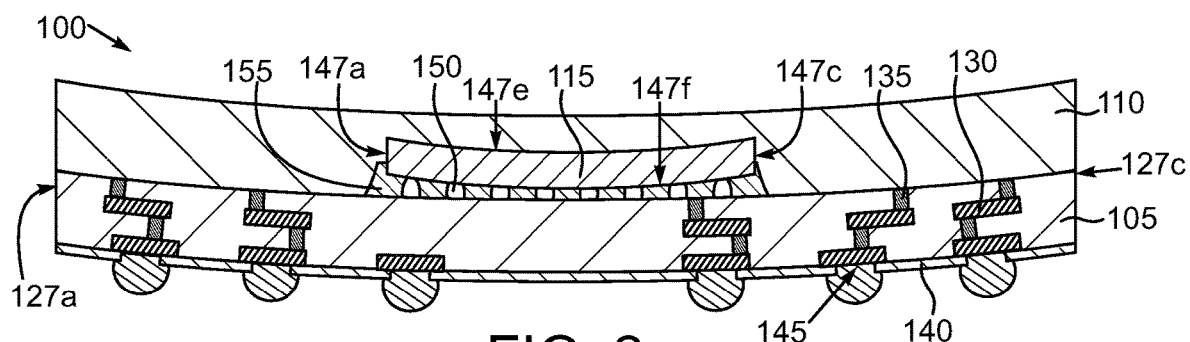
FIG. 2 is a sectional view of FIG. 1 taken at section 2-2.

Additional details of the conventional fan-out package 100 may be understood by referring now also to FIG. 2, which is a sectional view of FIG. 1 taken at section 2-2. The RDL structure 105 consists of one or more metallization layers that include plural conductor traces 130 and interlevel vias 135 all interspersed with dielectric materials, such as polyimide. A solder mask 140 composed of solder mask materials is formed on the lower surface of the RDL structure 105 and is patterned with plural openings 145 in which the solder balls 120 project and make contact with the metallization of the RDL structure 105. The semiconductor chip 115 is electrically connected to the RDL structure 105 by way of plural solder bumps 150. To address thermal stress issues caused by differences in the CTEs of the semiconductor chip 115 and the RDL structure 105, an underfill material 155 is placed in the gap between the chip 115 and the RDL structure 105.

As noted above, there is a plurality of physical mechanisms that contribute to the warpage of the conventional fan-out package 100. These include: (1) stress imbalances caused by the epoxy-based material of the molding layer 110 being present and contacting only five sides 147a, 147b, 147c, 147d and 147e of semiconductor chip 115 but not the sixth side 147f (not labeled in FIG. 1) thereof and (2) variable shrinkage, modulii differences, glass transition temperature Tg differences and differences in CTE between the molding layer 110, the dielectric of the RDL structure 105 and the semiconductor chip 115. Note that the upward warpage of the conventional package 100 can also produce warpage of the semiconductor chip 115 and the traces 130 and vias 135 of the RDL structure 105. The +z direction warpage depicted in FIGS. 1 and 2 can cause delamination of the solder balls 120 from an underlying circuit board (not shown) particularly those solder balls positioned close or at the corners and edges 125a, 125b, 125c and 125d and edges 127a, 127b, 127c and 127d of the molded fan-out package 100.

Figure 3:
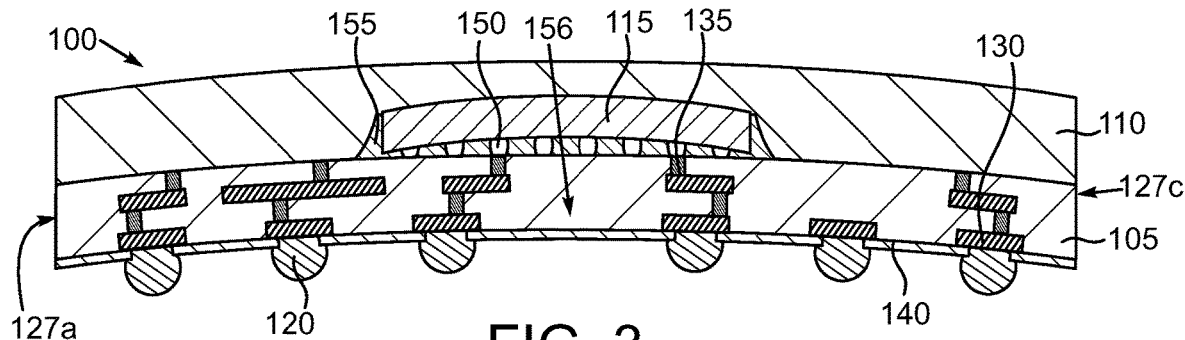
FIG. 3 is a sectional view like FIG. 2, but depicting an alternative conventional package warping scenario.

It should be understood that the severity and direction of the warpage of the conventional package 100 is temperature dependent. Thus, for example, the upper warpage depicted in FIGS. 1 and 2 can represent warpage that occurs through some temperature range for the molded fan-out package 100. However, above or below that temperature range, the conventional molded fan-out package 100 might exhibit a different warpage behavior. For example, and as shown in FIG. 3, which is a sectional view like FIG. 2 but depicting a different warpage pattern, namely, a downward or −z direction warpage of the various components of the molded fan-out package 100, such as the RDL structure 105, the molding layer 110, the semiconductor chip 115, the traces 130, the vias 135, the solder mask 140 and even the underfill 155. In this warpage scenario, delamination of the solder balls 120 from an underlying circuit board (not shown) can occur, particularly those solder balls 120 positioned nearer a center 156 of the molded fan-out package 100 than the corners and edges 125a, 125b, 125c and 125d and edges 127a, 127b, 127c and 127d thereof.

Figure 4:
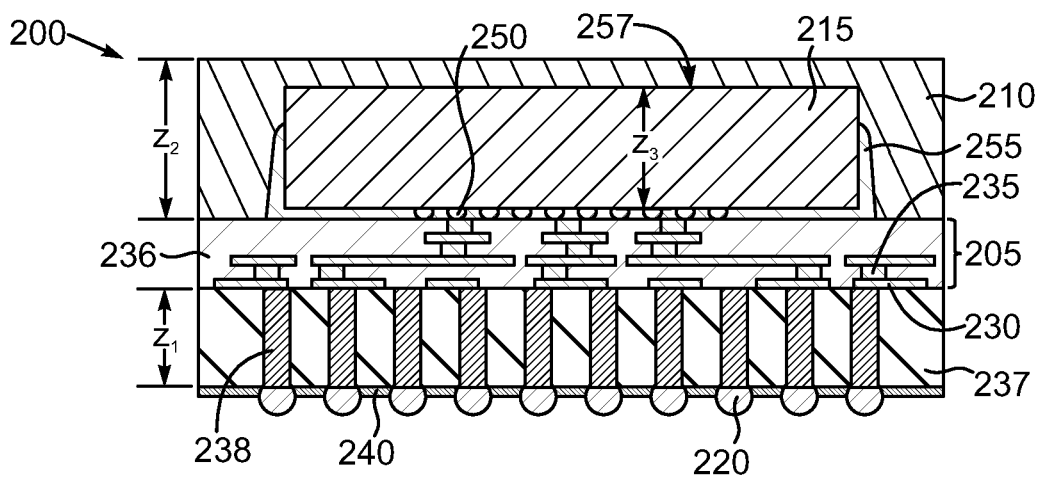
FIG. 4 is a sectional view of an exemplary arrangement of a molded semiconductor chip fan-out package.

A new exemplary arrangement of a molded fan-out package 200 may be understood by referring now to FIG. 4, which is a sectional view. The fan-out package 200 includes a RDL structure 205, a molding layer 210 molded thereon and a semiconductor chip 215 at least partially encased in the molding layer 210. It should be understood that multiple semiconductor chips like the chip 215 could be molded within the molding layer 210. The RDL structure 205 includes n RDL layers where n is equal to one or more. Each of the n RDL layers consists of a metallization layer that includes conductor traces 230. Successive metallization layers are interconnected by vias 235 interspersed with dielectric material 236 in one or more layers. The dielectric material 236 can be polybenzoxazoles, although other polymeric materials could be used, such as benzocyclobutene, high or low temperature polyimide or other polymers. The fan-out package 200 incorporates multiple features to combat the problem of package warpage. One of these is the incorporation of a second molding layer 237 molded on the lower surface of the RDL structure 205. The second molding layer 237 includes plural internal conductor structures 238, which are tall conductive pillars in this illustrative arrangement. The conductor structures 238 project downwardly and are ohmically connected to plural solder balls 220. The upper ends of the pillars 238 are ohmically connected to one or more of the conductor traces 230 of the RDL structure 205. A solder mask 240 is formed on the lower surface of the molding layer 237 and patterned appropriately to accommodate the placement of the solder balls 220 in contact with the conductor structures 238. The semiconductor chip 215 can be electrically connected to the RDL structure 205 by way of plural interconnects 250, which can be solder bumps, solder micro bumps, conductive pillars or other types of interconnects. To help alleviate issues of CTE differences, an underfill 255 can be interspersed between the chip 215 and the RDL structure 205. The molding layer 237 provides a stiffening structure to combat the propensity of the molded fan-out package 200 to warp either upwardly or downwardly. To combat warpage, the molding layer 237 can be fabricated with some desired thickness, $z_1$, and of particular materials that provides certain bending stiffness. In addition, the molding layer 210 can be fabricated with some thickness, $z_2$, and from materials that provides a desired bending stiffness. It should be understood that the thickness $z_2$ of the molding layer 210 can be greater than or the same as the thickness $z_3$ of the chip 215. It is also possible to mold the molding layer 210 and do a post-mold grind that either just exposes the upper surface 257 of the semiconductor chip 215 or even thins the semiconductor chip 215 to some thickness less than $z_3$.

It is desirable for the materials selected for the molding layers 210 and 237 to exhibit suitable viscosity at the applicable molding temperatures and have molding temperatures lower than the melting points of any of the solder structures present at the time of the molding processes. In an exemplary arrangement the materials for the molding layers 210 and 237 can have a molding temperature of about 165° C. Two commercial variants are Sumitomo EME-G750 and G760.

The conductor structures of the RDL structure 205 and the molding layer 237, and any disclose alternatives, can be composed of various conductor materials, such as copper, aluminum, silver, gold, platinum, palladium or others and alloys of these or others. The interconnects 220 and 250, and any disclosed alternatives, if composed of or incorporating solder, can be composed of various well-known solder compositions, such as tin-silver, tin-silver-copper or others. Well-known plating, chemical vapor deposition, physical vapor deposition or other application techniques can be used to fabricate the conductor structures disclosed herein.

Figure 5:
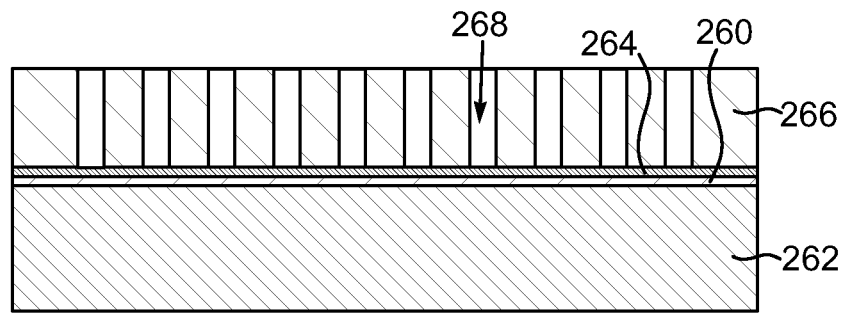
FIG. 5 is a sectional view depicting exemplary processing to fabricate the semiconductor chip device shown in FIG. 1.
Figure 6:
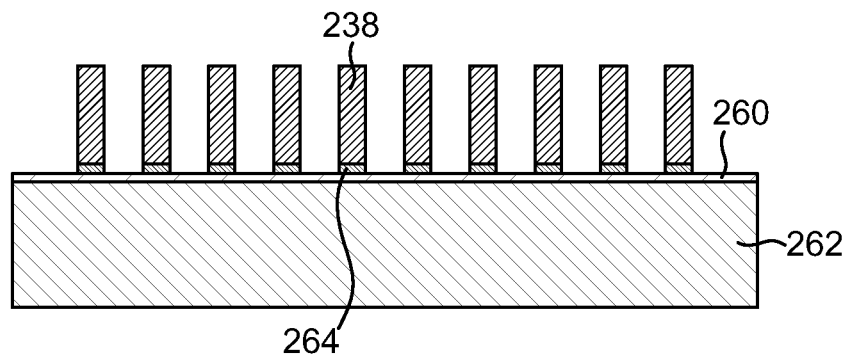
FIG. 6 is a sectional view like FIG. 5 but depicting exemplary additional processing to fabricate the exemplary semiconductor chip device.

An exemplary process for forming the molding fan-out package 200 can be understood by referring now to FIGS. 5, 6, 7, 8, 9, 10, 11, 12 and 13 and initially to FIG. 5, which is a sectional view. The initial stages are directed to the fabrication of the conductor structures 238 and the molding layer 237 shown in FIG. 4. Attention is turned first to FIG. 5. It should be understood that the following steps can be performed at the wafer level as described in more detail below in conjunction with a subsequent figure. Initially a release layer 260 is applied to a carrier wafer 262. The release layer 260 can be a light activated, thermally activated, or other type of adhesive or even some form of tape that can enable the carrier wafer 262 to be removed without destructively damaging the structures mounted thereon at the time of separation. The carrier wafer 262 can be composed of various types of glasses or even semiconductors, such as silicon. Next, a plating seed layer 264 is deposited on the release layer 260. The plating seed layer 264 can be composed of a variety of materials that are suitable for plating seed layers, such as copper or the like. The plating seed layer 264 can be applied by physical vapor deposition or electroless plating as desired. Next, a resist mask 266 is applied to the seed layer 264 and patterned lithographically to include a plurality of openings 268. Next, a plating process is used to fill the openings 268 with conducting material to create the conductor structures 238 depicted in FIG. 6. As shown in FIG. 6, subsequent to the plating process to form the conductive pillars 238, the resist mask 266 is removed by ashing, solvent stripping or combinations thereof. Following the removal of the resist mask 266, an etch process, such as a flash wet etch, is performed to remove portions of the plating seed layer 264 on the release layer 260 lateral to the conductor structures 238. The carrier wafer 262 provides structural support for these operations.

Figure 7:
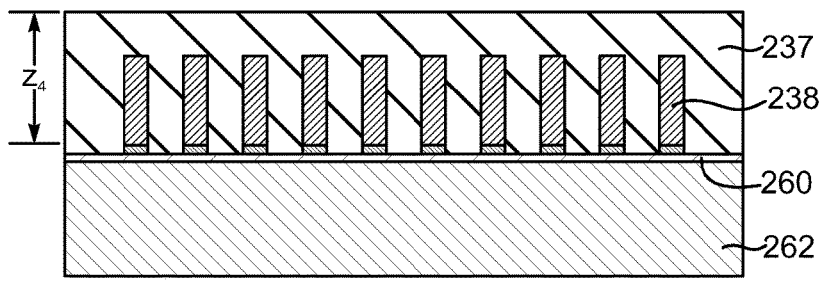
FIG. 7 is a sectional view like FIG. 6, but depicting exemplary molding layer fabrication.
Figure 8:
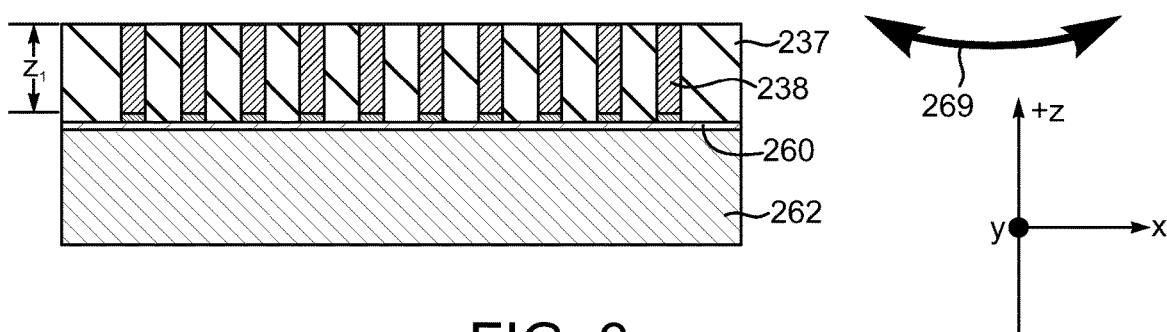
FIG. 8 is a sectional view like FIG. 7, but depicting exemplary mold thinning.

Next and as shown in FIG. 7, the molding layer 237 is molded over the conductor structures 238 and on the exposed portions of the release layer 260 using the exemplary materials disclosed elsewhere herein by way of compression molding. Note that the molding layer 237 is molded with some initial thickness $z_4$, which is greater than the plated height of the conductor structures 238. Next and as shown in FIG. 8, the molding layer 237 is subjected to a grinding process. The grinding process reduces the thickness of the molding layer from $z_4$ shown in FIG. 7 to the post grind thickness $z_1$. The grinding process also exposes the upper surfaces of the conductor structures 238. The carrier wafer 262 provides structural support for these operations. At this stage of the process, it is anticipated that the combination of the molding layer 237 and the conductor structures 238 will exhibit some +z direction warpage. The magnitude and direction of the warpage is depicted schematically and qualitatively by the curve 269.

Figure 9:
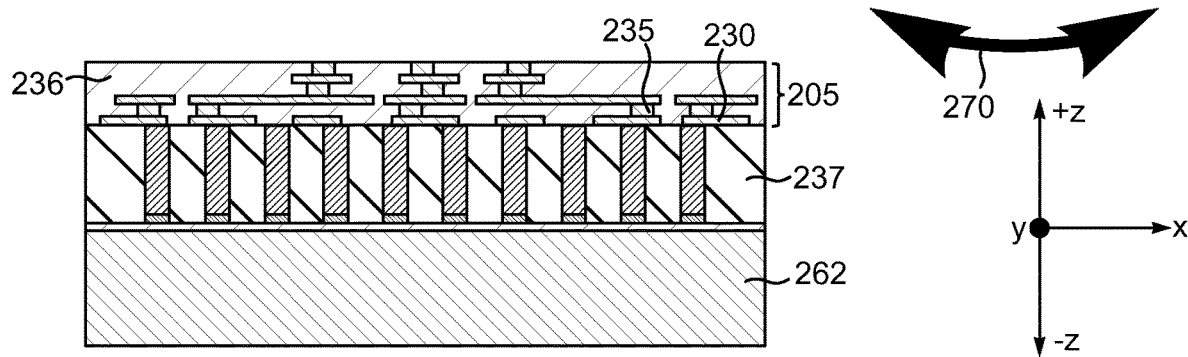
FIG. 9 is a sectional view like FIG. 8, but depicting exemplary RDL structure manufacturing.
Figure 10:
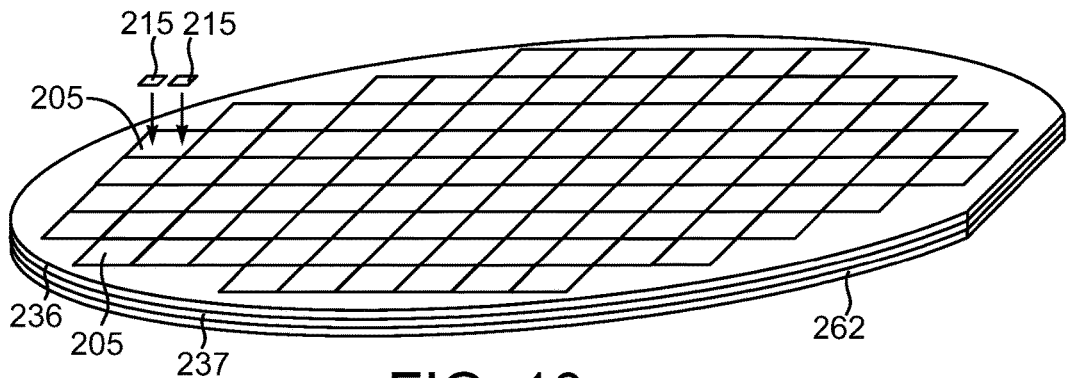
FIG. 10 is a pictorial view of an exemplary reconstituted wafer with molding layers and a carrier wafer.

The fabrication of the RDL structure 205 will now be described. Referring to FIG. 9, the RDL structure 205 is fabricated on the molding layer 237 in a series of process steps. As noted above, the RDL structure 205 includes plural conductor traces 230 in one or more layers interconnected by plural conductive vias 235. The traces 230 can be formed by either additive or subtractive processes, such as plating into a mask or blanket plating or deposition followed by mask placement followed by etch definition. The one or more layers of dielectric material 236 can be spin coated or otherwise deposited and baked or otherwise cured. If the dielectric material 236 of the RDL structure 205 is composed of photoimageable materials, such as the polymer materials disclosed elsewhere herein containing photoactive compounds, then the requisite openings in the multiple dielectric layers 236 can be formed by well-known lithography processes in order to accommodate the subsequent plating or otherwise deposition of the traces and vias 230 and 235. The carrier wafer 262 provides structural support for these operations. At this stage of the process, it is anticipated that the combination of RDL structure 205, the molding layer 237 and the conductor structures 238 will exhibit some +z direction warpage that is greater in magnitude than the state depicted in FIG. 7. The magnitude and direction of the warpage is depicted schematically and qualitatively by the curve 270.

As noted briefly above, the processes described in conjunction with FIGS. 5, 6, 7, 8 and 9 can be performed on a wafer level basis. In this regard, attention is now turned briefly to FIG. 10, which is a pictorial view depicting an exemplary carrier wafer 262, the molding layer 237 formed on the carrier wafer 262, and the one more dielectric layers 236 applied to the molding layer 237. The RDL structure 205 depicted in FIGS. 4-9 is one of several fabricated en masse on the molding layer 237. Indeed, the molding layer 237 similarly consists of discrete groups of conductor structures 238 that are obscured from view in FIG. 10, but shown in FIGS. 4 and 7-9. Note that one or more semiconductor chips 215 can be mounted on a given RDL structure 205.

Figure 11:
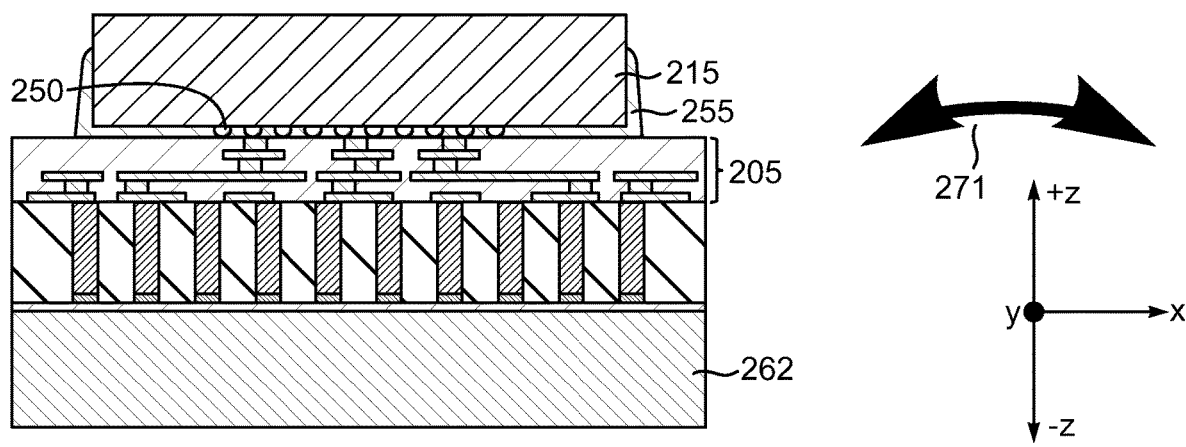
FIG. 11 is a sectional view like FIG. 9, but depicting exemplary semiconductor chip mounting.

As shown in FIG. 11, following the fabrication of the RDL structure 205, the semiconductor chip 215 is mounted thereon and electrical connections are established to the RDL structure 205 by way of the plural interconnects 250. The underfill 255 is applied using capillary action after the chip 215 is mounted or can be applied prior to ceding the chip 215. Note again that this process can be performed on a wafer level basis such that multiple semiconductor chips 215 can be mounted on the individual RDL structures 205 depicted in FIG. 10. At this stage of the process, it is anticipated that the combination of the semiconductor chip 215, the RDL structure 205, the molding layer 237 and the conductor structures 238 will exhibit some −z direction warpage. The magnitude and direction of the warpage is depicted schematically and qualitatively by the curve 271.

Figure 12:
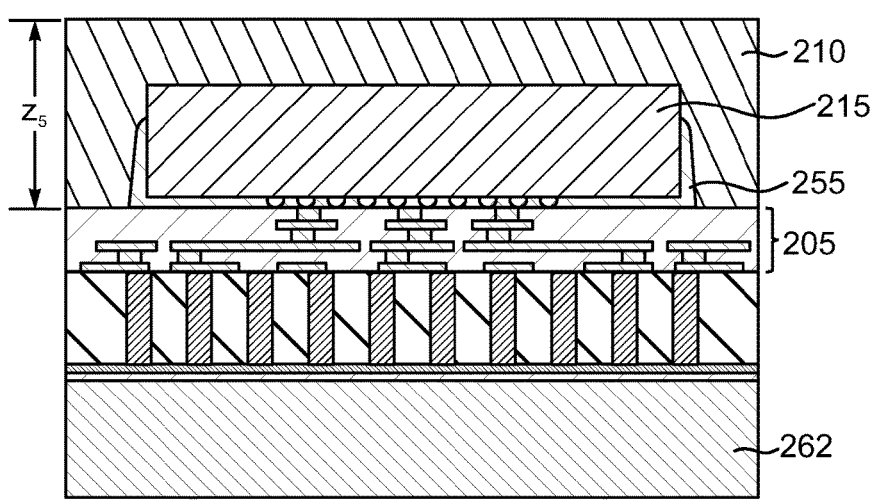
FIG. 12 is a sectional view like FIG. 11, but depicting exemplary molding.

Next and as shown in FIG. 12, the molding layer 210 is molded on the RDL structure 205 to at least partially encapsulate the semiconductor chip 215 and exposed portions of the underfill 255. Again, this can be performed at the wafer level. The molding layer 210 can be molded using well-known compression molding techniques and molded with some initial thickness $z_5$.

Figure 13:
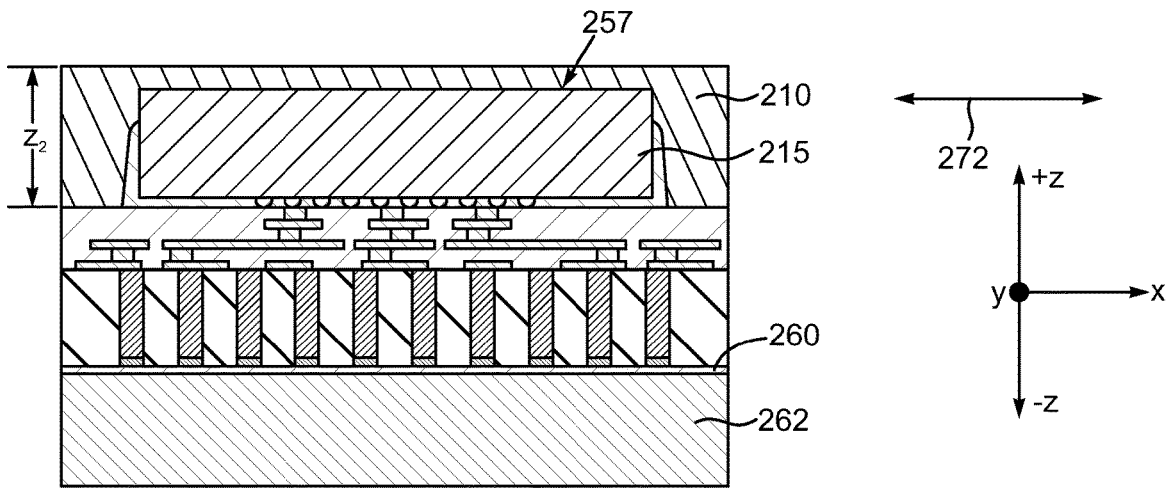
FIG. 13 is a sectional view like FIG. 12, but depicting exemplary optional mold thinning.

Next and as shown in FIG. 13, the molding layer 210 is subjected to a grinding process to reduce the thickness thereof from $z_5$ to $z_2$. This grinding process can be performed to leave some amount of the molding layer 210 over the semiconductor chip 215 or to just touch the upper surface 257 of the semiconductor chip 215 or even to actually grind away some of the upper surface 257 of the semiconductor chip 215. At this stage of the process, it is anticipated that the combination of the molding layer 210, the semiconductor chip 215, the RDL structure 205, the molding layer 237 and the conductor structures 238 will exhibit negligible warpage in either the −z or +z directions as represented schematically and qualitatively by the line 272. To achieve the desired negligible warpage, the materials for the molding layers 210 and 237 are selected with desired modulii and the over-mold volume of the molding layer 210 is controlled. The over-mold volume of the molding layer 210 is the product of the molding layer thickness $z_2$ and the length of the molding layer 210 measured along they axis. Of course, the molding layer thickness $z_2$ can be set by choosing particular values of mold thickness $z_5$ (see FIG. 12) without grinding and/or by combining particular values of mold thickness $z_5$ with particular levels of grind back.

Figure 14:
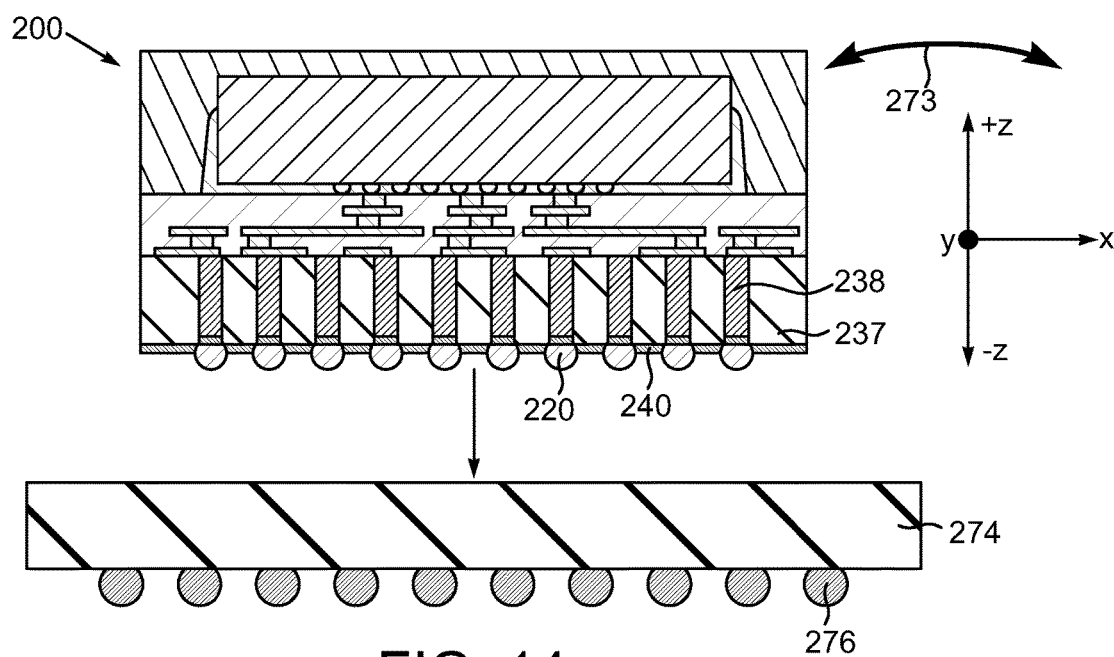
FIG. 14 is a sectional view depicting exemplary mounting of the semiconductor chip device on a circuit board.

Next and as shown in FIGS. 13 and 14, the molded fan-out package 200 is removed from the carrier wafer 262 depicted in FIG. 13 by activating the release layer 260 and the solder mask 240 can be applied to the lower surface of the molding layer 237 and appropriately patterned to provide openings leading to the conductor structures 238. Thereafter, the solder balls 220 can be applied to the conductor structures 238, by plating or stenciling followed by a reflow or by way of pick and place followed by a reflow. At this stage of the process, it is anticipated that the molded fan-out package 200 will exhibit some −z direction warpage. The magnitude and direction of the warpage is depicted schematically and qualitatively by the curve 273. The completed molded fan-out package 200 can then be mounted on another circuit board 274, which can be a package substrate, a system board or other type of circuit board. The circuit board 274 can, in turn, include interconnects 276, such as the depicted solder balls. Optionally, other types of interconnect such as pins or lands could be used. It is anticipated the mechanical behavior of the circuit board 274 and the post-reflow cooling of the interconnects 220 will largely cancel out the −z direction warpage of the molded fan-out package 200.

Figure 15:
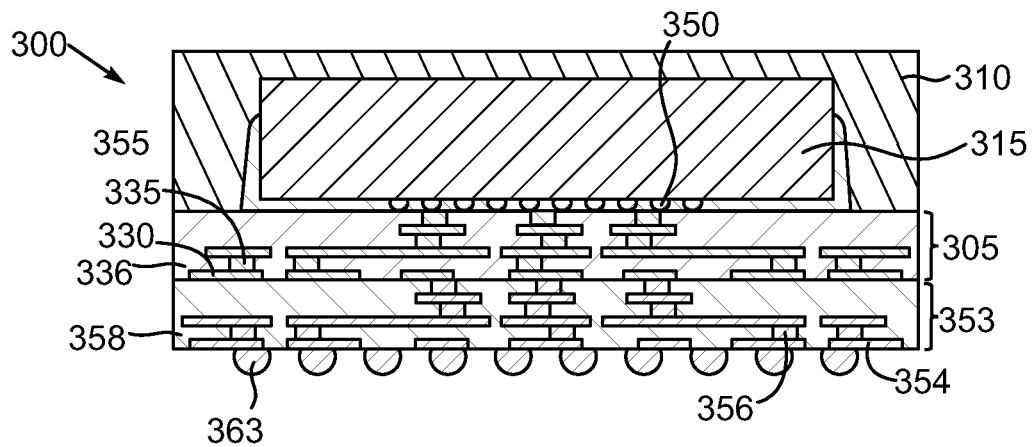
FIG. 15 is a sectional view of an alternate exemplary arrangement of a semiconductor chip device that includes multiple sets of RDL structure layers.

Another alternate exemplary arrangement of a molded fan-out package 300 can be understood by referring now to FIG. 15, which is a sectional view like FIG. 4. This exemplary arrangement of a molded fan-out package 300 shares several attributes with the molded fan-out package 200 depicted in FIG. 4. In this regard, the fan-out package 300 includes a RDL structure 305, a molding layer 310 molded on the RDL structure 305 that at least partially encases a semiconductor chip 315 mounted on the RDL structure 305 and connected thereto by plural interconnects 350 and cushioned against CTE differences by way of an underfill 355. However, in lieu of using the molding layer 237 and tall conductor structures 238 shown in FIG. 4 to combat warpage, a second RDL structure 353 is formed on the first RDL structure 305. The RDL structure 305 includes a set of n RDL layers where n is equal to one or more. Like the RDL structure 205 shown in FIG. 4, each of the RDL layers consists of a metallization layer that includes conductor traces 330. Successive metallization layers are interconnected by vias 335 interspersed with dielectric material 336 in one or more layers. The RDL structure 353 structure includes a set of m RDL layers, where m is equal to one or more and can be the same or different than the number n. The RDL structure 353 similarly includes plural conductor traces 354, plural vias 356 and one or more layers of dielectric material 358. Interconnects 363 to electrically connect the package 300 to some other circuit structure, such as a circuit board, are mounted on the RDL structure 353 in ohmic contact with one or more of the conductive traces 354. The usage of two stacked RDL structures 305 and 353 provide not only a greater number of possible electrical pathways for power, ground and signals but also can be tailored to combat the undesirable warpage that the package 300 might otherwise undergo.

Figure 16:
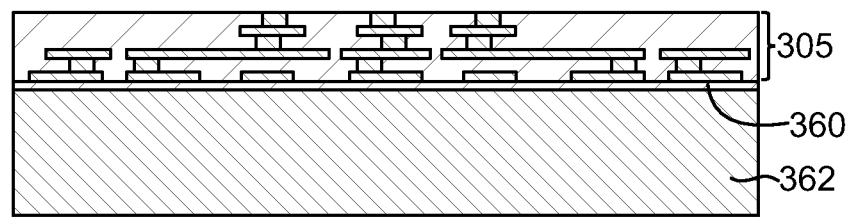
FIG. 16 is a sectional view depicting exemplary RDL structure manufacturing.

An exemplary process for fabricating the dual RDL fan-out package 300 shown in FIG. 15 may be understood by referring now to FIGS. 16, 17, 18, 19, 20 and 21 and initially to FIG. 16. Initially, a release layer 360 is applied to a carrier wafer 362 and thereafter the RDL structure 305 is formed thereon using the techniques disclosed above for the RDL structure 205 depicted in FIG. 4. The release layer 360 and the carrier wafer 362 can be configured like the release layer 260 and the carrier wafer 260 described above.

Figure 17:
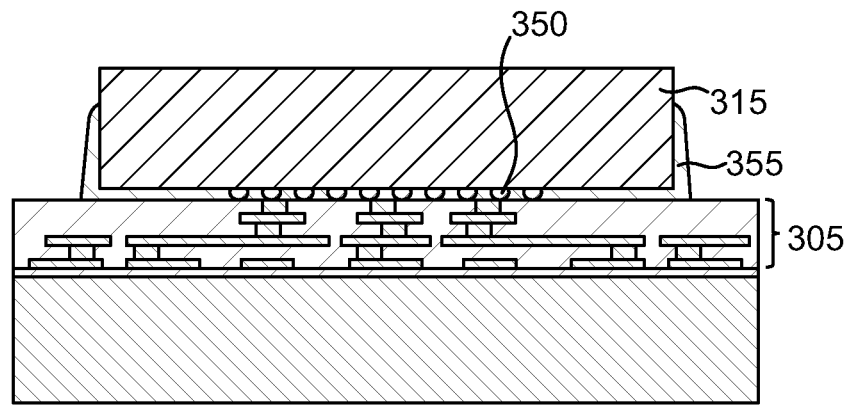
FIG. 17 is a sectional view like FIG. 16, but depicting exemplary semiconductor chip mounting on the RDL structure.

Next and as shown in FIG. 17, the semiconductor chip 315 is mounted on the RDL structure 305 and electrically connected thereto by way of the interconnects 350. The underfill 355 can be applied using the techniques disclosed above for the underfill 255 as shown in FIG. 4. The carrier wafer 362 provides structural support for these operations.

Figure 18:
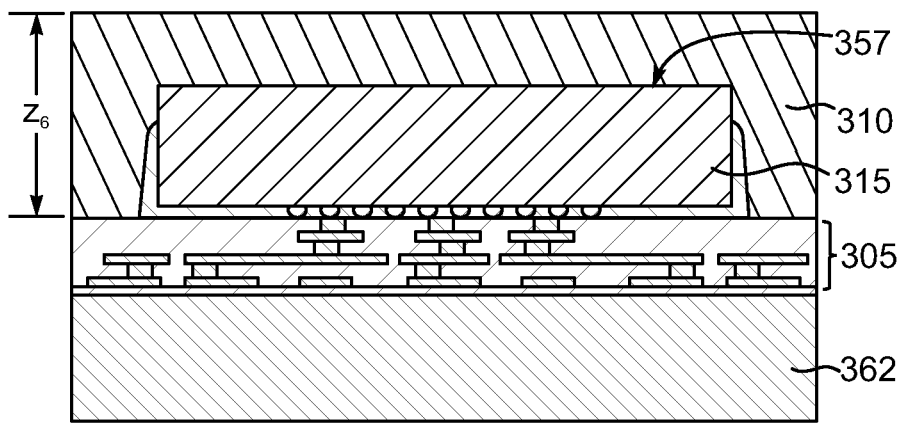
FIG. 18 is a sectional view like FIG. 17, but depicting exemplary molding on the RDL structure.

Next and as shown in FIG. 18, the molding layer 310 is molded onto the RDL structure 305 to at least partially encapsulate the semiconductor chip 315 and the underfill 355. The molding layer 310 can be molded with some initial thickness $z_6$ such that the upper surface 357 of the chip 315 is covered. The carrier wafer 362 provides structural support for these operations.

Figure 19:
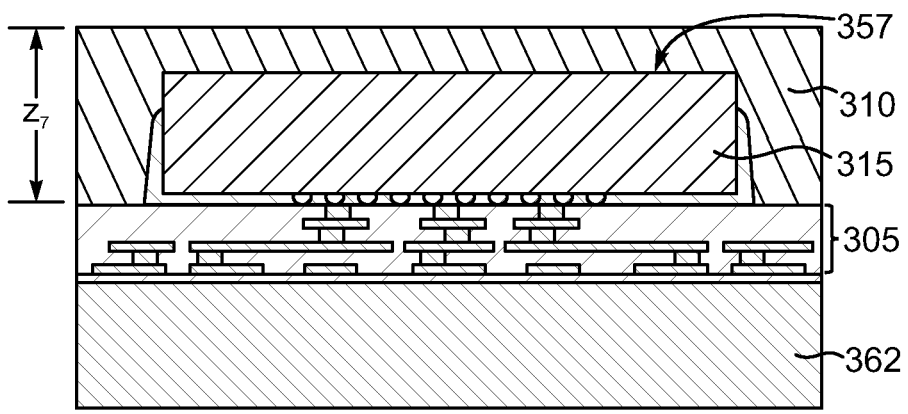
FIG. 19 is a sectional view like FIG. 18, but depicting exemplary optional thinning of the molding layer.

Next, and as shown in FIG. 19, the molding layer 310 is subjected to a grinding process to reduce the thickness thereof from $z_6$ to $z_7$. The post-grind thickness $z_7$ can be selected to keep the upper surface 357 of the semiconductor chip 315 covered with the molding layer 310 or can be such that the upper surface 357 is just exposed or even such that the grinding process removes portions of the upper reaches of the semiconductor chip 315. The carrier wafer 362 provides structural support for these operations.

Figure 20:
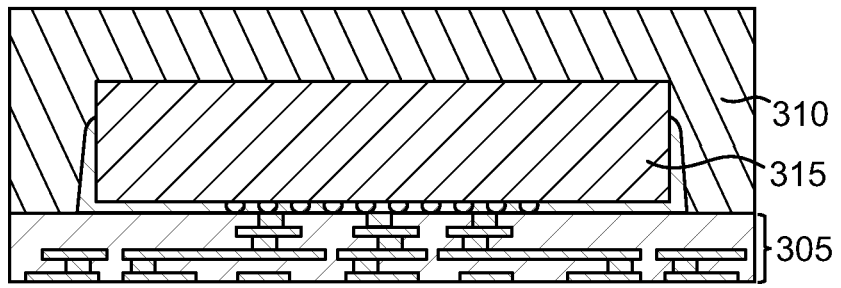
FIG. 20 is a sectional view like FIG. 19, but depicting exemplary carrier wafer detachment.
Figure 21:
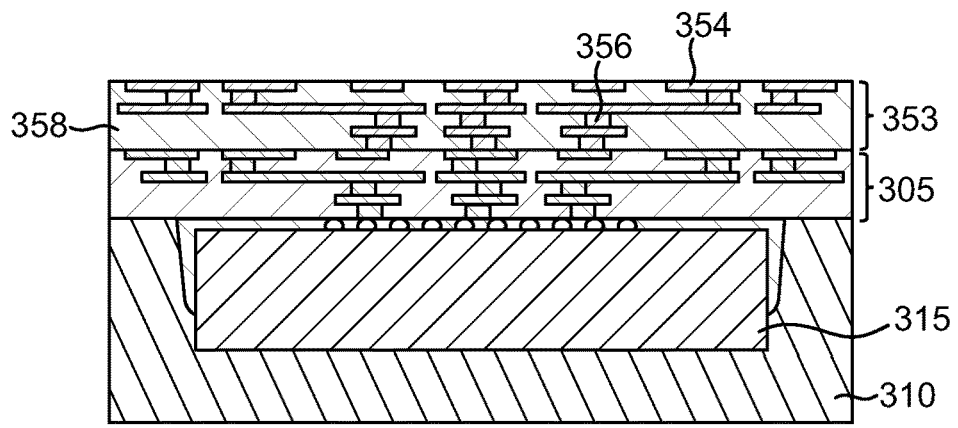
FIG. 21 is a sectional view like FIG. 20, but depicting exemplary fabrication of a second set of RDL structure layers.

Next and as shown in FIG. 20, the carrier wafer 362 depicted in FIG. 19 is removed from the combination of the RDL structure 305 and the molding layer 310 and the chip 315. With the carrier wafer 362 removed, the combination of the RDL structure 305 and the molding layer 310 and the chip 315 is flipped over from the orientation depicted in FIG. 20 and the RDL structure 353 is formed on the RDL structure 305 as shown in FIG. 21 using the same techniques that were used to fabricate the RDL structure 305. Thus, multiple material deposition patterning and other steps, etc. are used to establish the conductor traces 354, the conductive vias 356 and one or more insulating layers 358.

Figure 22:
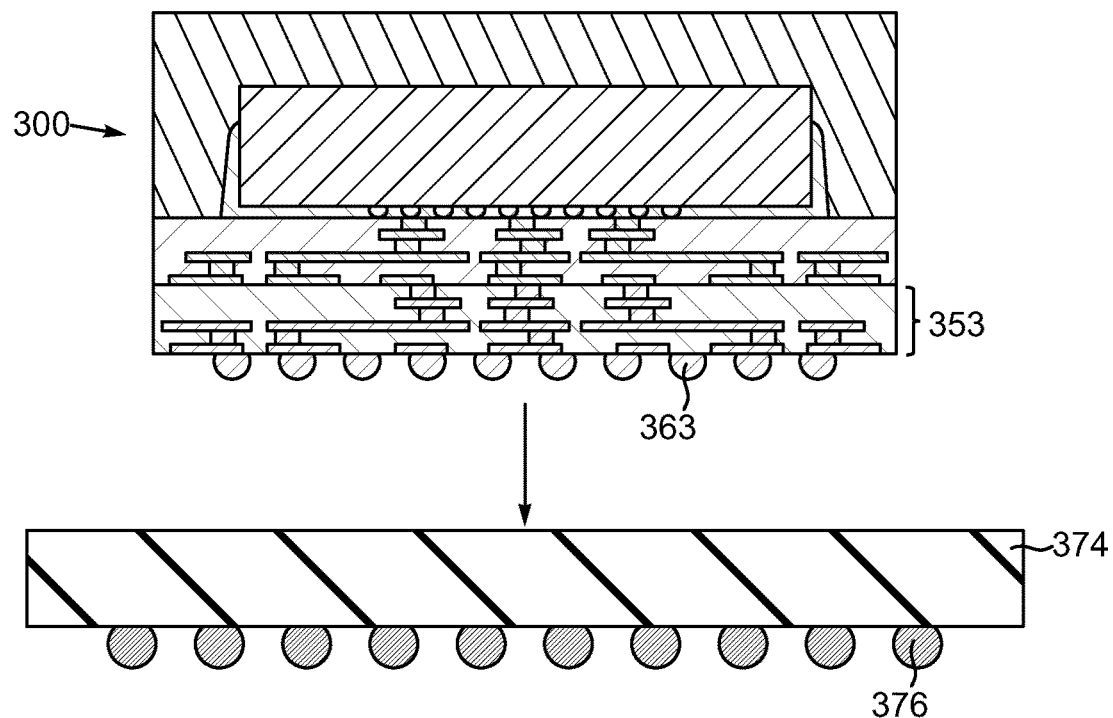
FIG. 22 is a sectional view like FIG. 21, but depicting exemplary mounting of the multiple RDL layer set package on a circuit board.

Next, and as shown in FIG. 22, the interconnects 363 are applied to the RDL structure 353 to complete the molded fan-out package 300. The interconnects 363 can be configured and applied like the interconnects 220 depicted in FIG. 4. The molded fan-out package 300 can thereafter be mounted on a circuit board 374, which can be like the circuit board 274 described above, and thus include interconnects 376 of the type described above.

Figure 23:
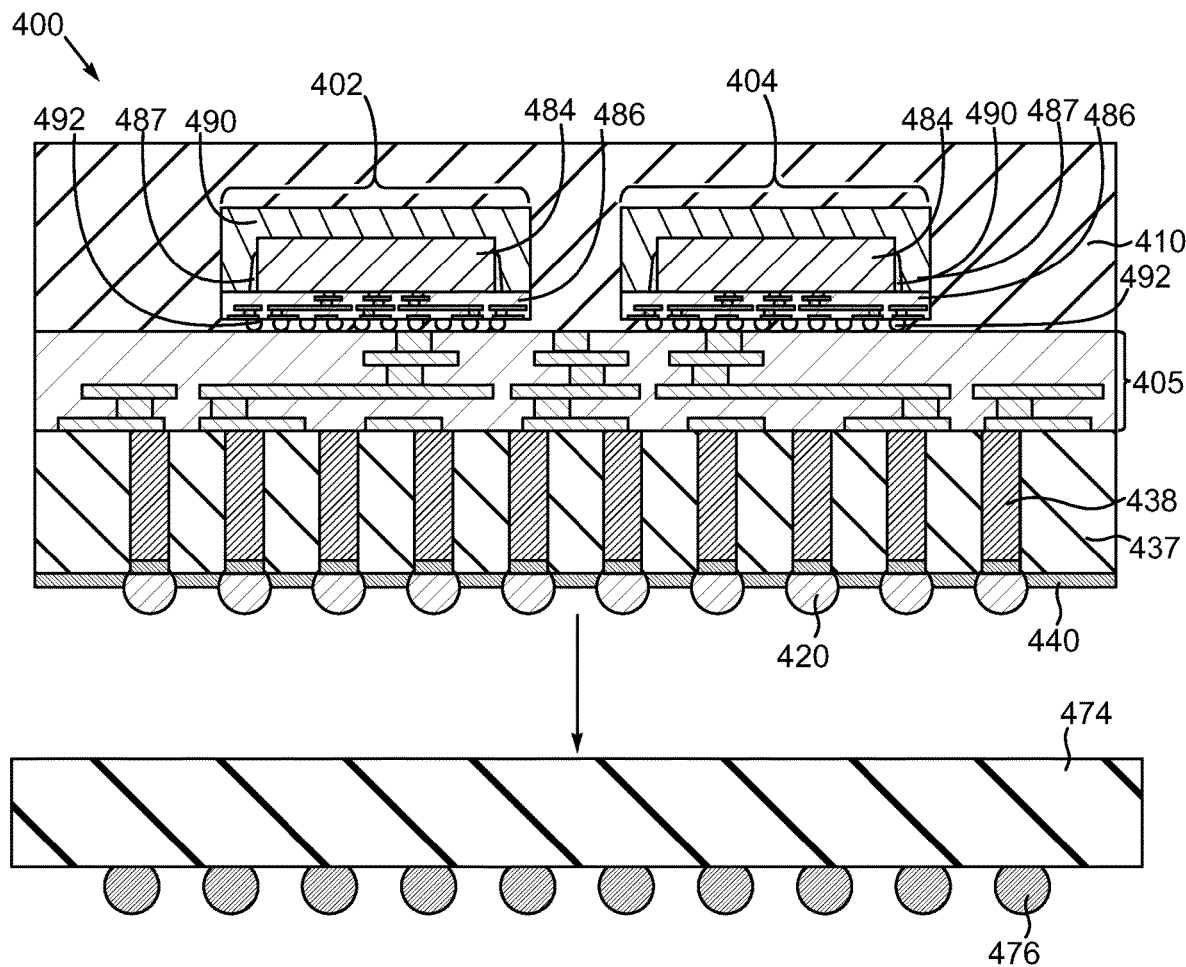
FIG. 23 is a sectional view depicting another alternate exemplary molded fan-out package arrangement.
Figure 24:
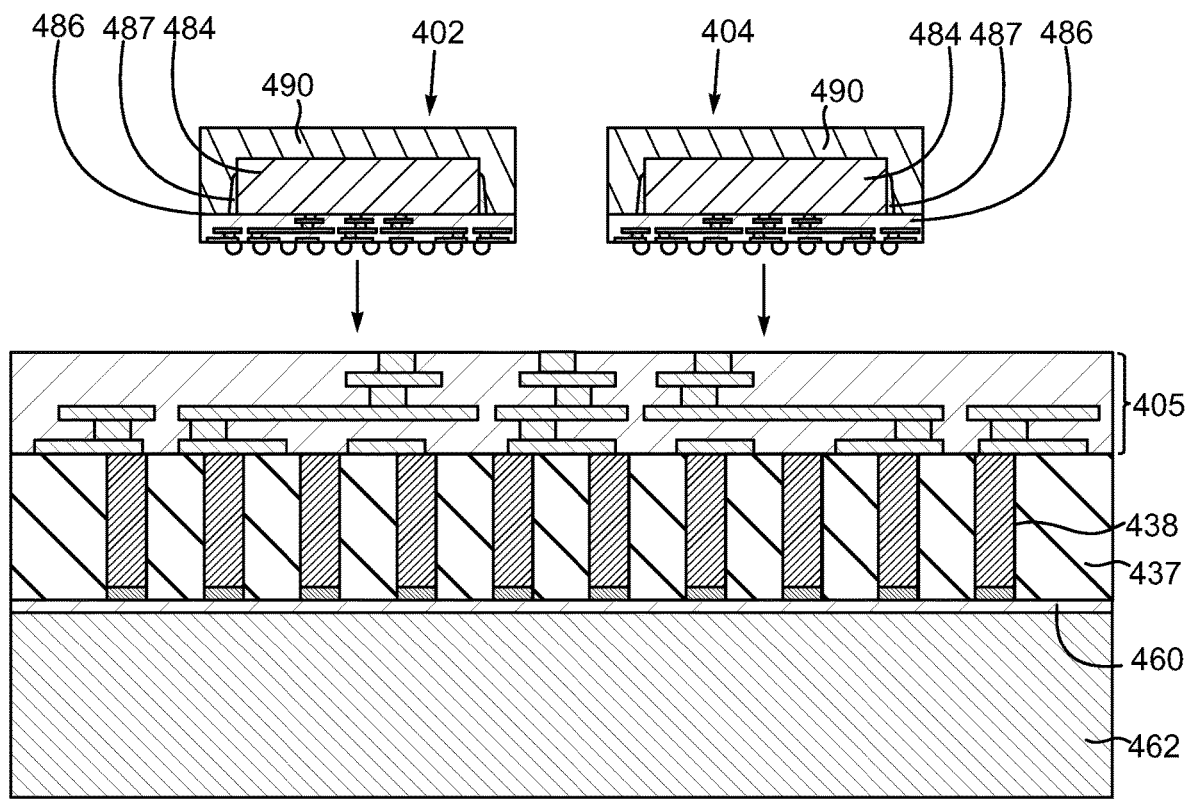
FIG. 24 is a sectional view depicting two exemplary molded fan-out packages mounted on another RDL structure and molding layer.
Figure 25:
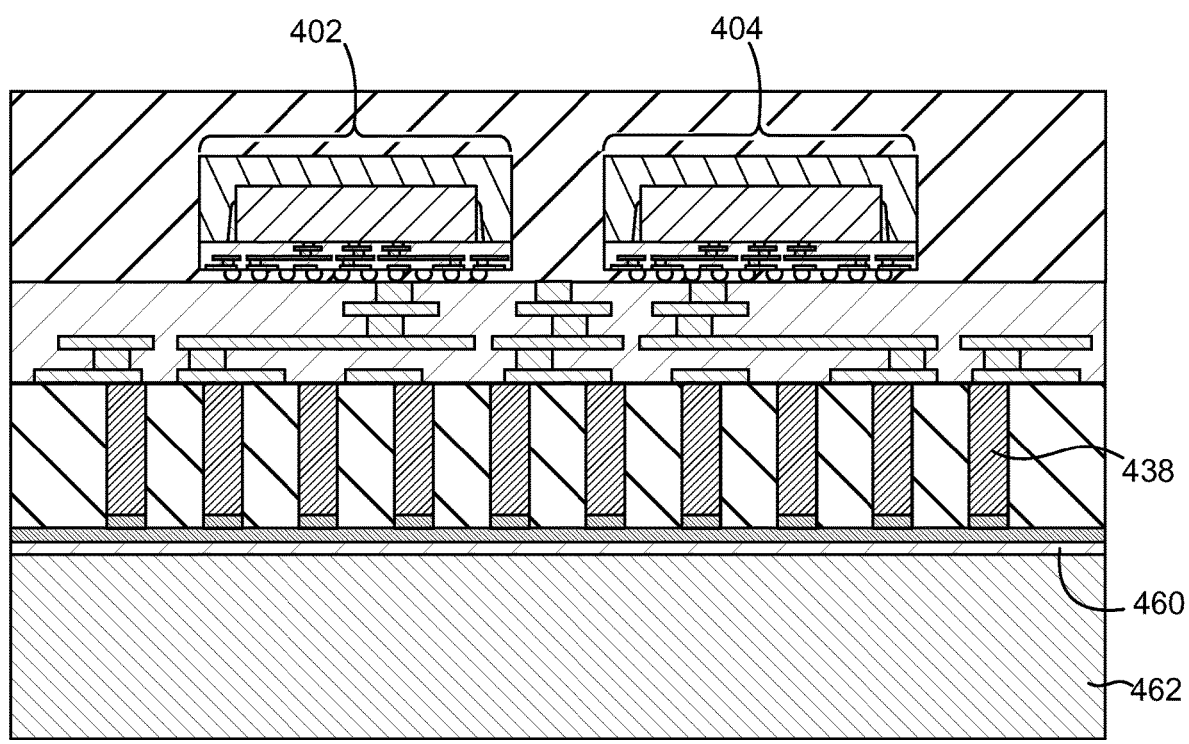
FIG. 25 is a sectional view like FIG. 24, but depicting molding an additional layer over the multiple fan-out packages.

Another new arrangement of a molded fan-out package 400 that provides greater numbers of RDL layers and can combat the problem of package warpage may be understood by referring now to FIGS. 23, 24 and 25 and initially to FIG. 23. Here, the molded fan-out package 400 can include two smaller-scale molded fan-out packages 402 and 404 mounted on a RDL structure 405 and at least partially encased in a molding layer 410. The RDL structure 405 is positioned on a molding layer 437 that includes plural conductor structures 438. The molding layer 437 and the conductor structures 438 can be composed of the same types of materials and manufactured in the same way as the molding layer 237 and the conductor structures 238 depicted in FIG. 4 and described above. Indeed, a solder mask 440 can be formed on the lower surface of the molding layer 437 and plural interconnects 420 can be connected to the conductor structures 438. The molded fan-out package 400 can be mounted on another circuit board 474 and interconnected thereto by way of the interconnects 420, which can be like the interconnects 220 described elsewhere herein. The circuit board 474 can, in turn, include interconnects 476 and can be configured like the circuit boards 274 and 374 described above. It should be understood that each of the molded packages 402 and 404 includes a semiconductor chip 484 (or more chips), a RDL structure 486, an underfill 487, plural interconnects 488 as well as a molding layer 490 that at least partially encapsulates the chip 474, and interconnects 492 to connect to the RDL structure 486. The RDL structures 405 and 486 can be configured like the RDL structures 205, 305 and 353 discussed above in conjunction with FIGS. 4 and 15. The interconnects can be like the interconnects 250 described elsewhere herein. The packages 402 and 404 share the RDL structure 405 and the molding layer 437 and the pillars 438. To this end, the packages 402 and 404 can be relatively smaller than the RDL structure 405, whereas in the molded fan-out package 200 arrangement described above and depicted in FIG. 4, the semiconductor chip 215 is closer in at least lateral size or footprint to the footprints of the underlying RDL structure 205 and the molding layer 237. This size differential in the arrangement depicted in FIGS. 23, 24 and 25 can be achieved either scaling up the size of the RDL structure 405 and the molding layer 437 or by scaling down the sizes of the molded fan-out packages 402 and 404 or some combination of the two.

An exemplary process for fabricating the multi-die fan-out package 400 depicted in FIG. 23 can be understood by referring now to FIGS. 24 and 25. Initially, a release layer 460 is applied to a carrier wafer 462. Thereafter, the molding layer 437 is fabricated on the release layer 460 and the carrier wafer 462 and the conductor structures 438 are formed therein using the techniques described above in conjunction with the fabrication of the molding layer 237 and the conductor structures 238 shown in FIG. 4. Thereafter, the RDL structure 405 is formed on the molding layer 437 again using the techniques generally described above in conjunction with the RDL structure 205 depicted in FIG. 4. Thereafter, the molded packages 402 and 404 are mounted on the RDL structure 405. It should be understood that for example the molded package 402 can be fabricated by first fabricating the RDL structure 486, at the wafer level, as desired. Thereafter a mounting of the semiconductor chip 484 thereon followed by an underfill material process to apply the underfill 487 and a molding of the molding layer 490 and mounting of the interconnects 492 thereon are performed. The same processes can be applied to the package 404 as well. The fabrication of the RDL structure 486, the underfill 487 and the molding layer 490 can be like the processes used to fabricate the chip 215 on the RDL 205 and the molding layer 210 described above.

Next, and as shown in FIG. 25, the molding layer 410 is formed to at least partially encapsulate the molded packages 402 and 404. The process to apply the molding layer 410 can be like the processes used to apply the molding layer 210 described above. Thereafter, the carrier wafer 462 can be removed by deactivation of the release layer 460 or otherwise and the solder mask 440 and the interconnects 420 can be attached to the conductor structures 438 in the molding layer 437 as depicted in FIG. 23 and using the same type of techniques described above for the solder mask 240 and interconnects 220 shown in FIG. 4.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A semiconductor chip device, comprising:
a single semiconductor chip;
a first molding layer having internal conductor structures;
a first redistribution layer (RDL) structure positioned on the first molding layer and including fan-out connections to the internal conductor structures;
a second RDL structure positioned on the first RDL structure and including fan-out connections to the first RDL structure, the single semiconductor chip positioned on and electrically connected to the second RDL structure, wherein the first RDL structure is connected to the internal conductor structures of the first molding layer and to the second RDL structure; and
a second molding layer positioned on the second RDL structure and at least partially encapsulating the semiconductor chip.

2. The semiconductor chip device of claim 1, wherein the internal conductor structures comprise conductive pillars.

3. The semiconductor chip device of claim 1, wherein the first RDL structure comprises a first amount of redistribution layers and the second RDL structure comprises a second amount of redistribution layers.

4. The semiconductor chip device of claim 1, wherein the internal conductor structures are electrically connected to plural interconnects, the plural interconnects being configured to electrically connect the semiconductor chip to a circuit board.

5. The semiconductor chip device of claim 1, wherein the first and second RDL structures comprise plural conductive traces and plural conductive vias.

6. A method of manufacturing a semiconductor chip device, comprising:
forming a first molding layer having internal conductor structures;
forming a first redistribution layer (RDL) structure on the first molding layer and including fan-out connections to the internal conductor structures;
forming, after forming the first RDL structure on the first molding layer, a second RDL structure on the first RDL structure and including fan-out connections to the first RDL structure, wherein the first RDL structure is connected to the internal conductor structures of the first molding layer and to the second RDL structure;
mounting a semiconductor chip on and in electrical connection with the second RDL structure; and
forming a second molding layer on the second RDL structure and at least partially encapsulating the semiconductor chip.

7. The method of claim 6, comprising electrically connecting plural interconnects to the internal conductor structures, the plural interconnects being configured to electrically connect the semiconductor chip to a circuit board.

8. The method of claim 6, wherein the internal conductor structures comprise conductive pillars.

9. The method of claim 6, wherein the first RDL structure comprises a first amount of redistribution layers and the second RDL structure comprises a second amount of redistribution layers.

10. The method of claim 6, wherein forming the internal conductor structures includes performing a plating process.

11. The method of claim 6, further comprising thinning the second molding layer.

12. The method of claim 11, wherein thinning the second molding layer includes exposing a surface of the semiconductor chip.

13. The method of claim 6, wherein the first and second RDL structures comprise plural conductive traces and plural conductive vias.

14. A computer system, comprising:
a system board;
wherein the system board comprises one or more chip packages, wherein at least one of the one or more chip packages comprises:
a single semiconductor chip;
a first molding layer having internal conductor structures;
a first redistribution layer (RDL) structure positioned on the first molding layer and including fan-out connections to the internal conductor structures;
a second RDL structure positioned on the first RDL structure and including fan-out connections to the first RDL structure, the single semiconductor chip positioned on and electrically connected to the second RDL structure, wherein the first RDL structure is connected to the internal conductor structures of the first molding layer and to the second RDL structure; and
a second molding layer positioned on the second RDL structure and at least partially encapsulating the semiconductor chip.

15. The computer system of claim 14, wherein the system board comprises plural interconnects, the plural interconnects being configured to electrically connect the semiconductor chip to the system board.

16. The computer system of claim 14, wherein the internal conductor structures comprise conductive pillars.

17. The computer system of claim 14, wherein the first RDL structure comprises a first amount of redistribution layers and the second RDL structure comprises a second amount of redistribution layers.

18. The computer system of claim 14, wherein the first and second RDL structures comprise plural conductive traces and plural conductive vias.

* * * * *